US012683520B2

(12) United States Patent
Matsuoka et al.

(10) Patent No.: US 12,683,520 B2
(45) Date of Patent: Jul. 14, 2026

(54) POWER CONVERSION DEVICE

(71) Applicant: DENSO CORPORATION, Kariya-city (JP)

(72) Inventors: Tetsuya Matsuoka, Kariya-city (JP); Yuta Hashimoto, Kariya-city (JP); Masataka Deguchi, Kariya-city (JP); Tatsuya Murakami, Kariya-city (JP); Yoshinori Hayashi, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 175 days.

(21) Appl. No.: 18/594,127

(22) Filed: Mar. 4, 2024

(65) Prior Publication Data

US 2024/0213887 A1     Jun. 27, 2024

Related U.S. Application Data

(63) Continuation of application No. PCT/JP2022/036294, filed on Sep. 28, 2022.

(30) Foreign Application Priority Data

Oct. 15, 2021     (JP) ................................. 2021-169738

(51) Int. Cl.
  *H02M 7/537*     (2006.01)
  *H02M 1/088*     (2006.01)
  (Continued)

(52) U.S. Cl.
  CPC ........... *H02M 7/537* (2013.01); *H02M 7/003* (2013.01); *H02M 7/5387* (2013.01);
  (Continued)

(58) Field of Classification Search
CPC combination set(s) only.
See application file for complete search history.

(56) References Cited

FOREIGN PATENT DOCUMENTS

JP      2003031765 A  *  1/2003  ........... H01L 23/473
JP         3910383 B2     4/2007
            (Continued)

OTHER PUBLICATIONS

Translated Description of JP2003031765A (Year: 2003).*
Translated Description of JP2013236476A (Year: 2013).*
Translated Description of JP5262752B2 (Year: 2013).*

*Primary Examiner* — Monica Lewis
*Assistant Examiner* — Jared Raymond Hausman
(74) *Attorney, Agent, or Firm* — Oliff PLC

(57)     ABSTRACT

In a power conversion device, first-phase semiconductor modules are successively arranged in a first direction to form a part of a first row. Second-phase semiconductor modules are successively arranged in the first direction to form a part of a second row while facing the first-phase semiconductor modules. Third-phase semiconductor modules are arranged in a second direction so that one of the third-phase semiconductor modules forms a part of the first row and another of the third-phase semiconductor modules forms a part of the second row. The first row and the second row have surfaces facing each other and from which output terminals protrude. Each of output conductors extends from a connected portion of an output terminal in a direction away from the third-phase semiconductor modules.

10 Claims, 7 Drawing Sheets

Drive Circuit

(51) Int. Cl.
  *H02M 7/00*     (2006.01)
  *H02M 7/5387*    (2007.01)
  *H05K 7/20*     (2006.01)

(52) U.S. Cl.
  CPC ..... *H05K 7/20927* (2013.01); *H05K 7/20936*
      (2013.01); *H02M 1/088* (2013.01)

(56)       References Cited

FOREIGN PATENT DOCUMENTS

JP        5262752 B2  *  8/2013
JP       2013236476 A  *  11/2013

* cited by examiner

Drive Circuit

POWER CONVERSION DEVICE

CROSS REFERENCE TO RELATED APPLICATIONS

The present application is a continuation application of International Patent Application No. PCT/JP2022/036294 filed on Sep. 28, 2022, which designated the U.S. and claims the benefit of priority from Japanese Patent Application No. 2021-169738 filed on Oct. 15, 2021. The entire disclosures of all of the above applications are incorporated herein by reference.

TECHNICAL FIELD

The present disclosure relates to a power conversion device.

BACKGROUND

A power conversion device has six power modules forming a three-phase inverter.

SUMMARY

According to at least one embodiment of the present disclosure, a power conversion device includes semiconductor modules and midpoint conductors. The semiconductor modules form a power conversion circuit including upper-and-lower arm circuits operable in three phases. The semiconductor modules includes power terminals and midpoint terminals. The midpoint terminals form midpoints of the upper-and-lower arm circuits. The midpoint conductors electrically connect common-phase terminals of the midpoint terminals. The semiconductor modules include first modules, second modules and third modules. The first modules form a first-phase circuit of the upper-and-lower arm circuits and are successively arranged in a first direction so as to form a part of a first row of the semiconductor modules. The second modules form a second-phase circuit of the upper-and-lower arm circuits and are successively arranged in the first direction so as to form a part of a second row of the semiconductor modules. The second modules face the first modules in a second direction perpendicular to the first direction. The third modules form a third-phase circuit of the upper-and-lower arm circuits and arranged in the second direction. At least one of the third modules forms a part of the first row, and a rest of the third modules forms a part of the second row. The midpoint conductors include a first conductor electrically connecting midpoint terminals of the first modules, a second conductor electrically connecting midpoint terminals of the second modules, and a third conductor electrically connecting midpoint terminals of the third modules. Semiconductor modules forming the first row have surfaces facing the second row and from which midpoint terminals protrude toward the second row. Semiconductor modules forming the second row have surfaces facing the second row and from which midpoint terminals protrude toward the first row. Each of the midpoint conductors extends in the first direction from a connected portion of a corresponding midpoint terminal toward a side of the power conversion device. The first modules and the second modules are disposed between the side of the power conversion device and the third modules in the first direction.

BRIEF DESCRIPTION OF DRAWINGS

The details of one or more embodiments are set forth in the accompanying drawings and the description below.

Other features and advantages will be apparent from the description and drawings, and from the claims.

DETAILED DESCRIPTION

Figure 1:
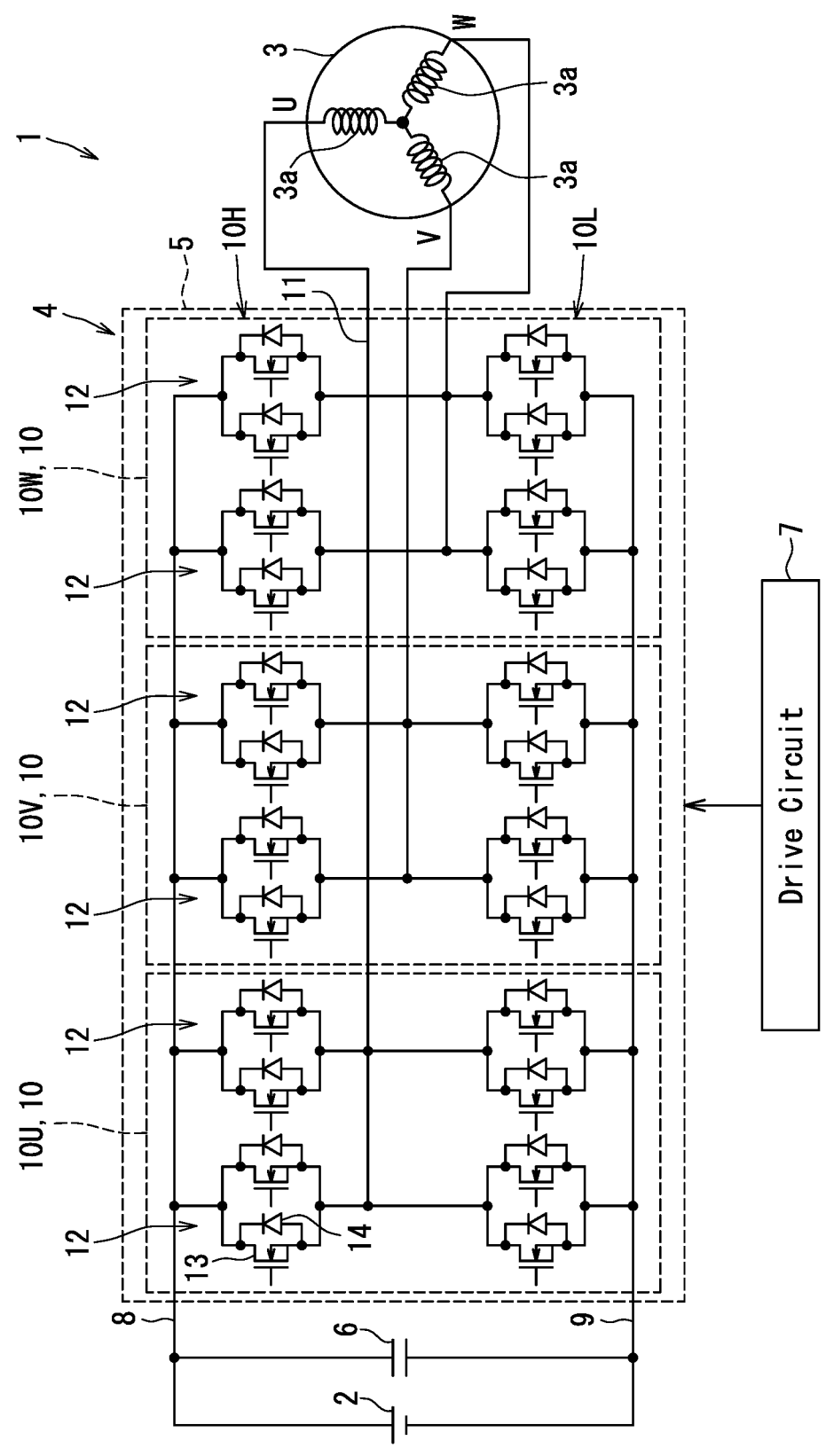
FIG. 1 illustrates a circuit configuration and a drive system of a power conversion device according to a first embodiment.

To begin with, examples of relevant techniques will be described. A power conversion device according to a comparative example has six power modules forming a three-phase inverter. The six power modules are arranged in two rows of three each. The contents of the literature (JP 3910383 B2) are incorporated by reference as explanations of technical elements in this description.

The power modules are arranged in the order of a U phase, a V phase, and a W phase in each row. The power modules forming an upper arm of each phase are arranged in a first row, and the power modules forming a lower arm of each phase are arranged in a second row. The power modules in each row are arranged in a first direction. An emitter terminal of the upper arm module and a collector terminal of the lower arm module face each other and have a predetermined distance therebetween in a second direction perpendicular to the first direction. The collector terminal is electrically connected to the emitter terminal via an output conductor of a corresponding phase. Three-phase output conductors extend in a third direction perpendicular to the first direction and the second direction, thereby being led out in the same direction while being electrically isolated from each other. It is therefore difficult to reduce size in the third direction, i.e., height of the power conversion device.

Also when one power module provides one series circuit, and multiple series circuits are connected in parallel to form the upper-and-lower arm circuit of each phase, the power conversion device is difficult to be reduced in height.

In contrast, according to the present disclosure, a power conversion device can be reduced in height.

A power conversion device according to the present disclosure includes semiconductor modules and midpoint conductors. The semiconductor modules form a power conversion circuit including upper-and-lower arm circuits operable in three phases. The semiconductor modules includes power terminals and midpoint terminals. The midpoint terminals form midpoints of the upper-and-lower arm circuits. The midpoint conductors electrically connect common-phase terminals of the midpoint terminals. The semiconductor modules include first modules, second modules and third modules. The first modules form a first-phase circuit of the upper-and-lower arm circuits and are successively arranged in a first direction so as to form a part of a first row of the semiconductor modules. The second modules form a second-phase circuit of the upper-and-lower arm circuits and are successively arranged in the first direction so as to form a part of a second row of the semiconductor modules. The second modules face the first modules in a second direction perpendicular to the first direction. The third modules form a third-phase circuit of the upper-and-lower arm circuits and arranged in the second direction. At least one of the third modules forms a part of the first row, and a rest of the third modules forms a part of the second row. The midpoint conductors include a first conductor electrically connecting midpoint terminals of the first modules, a second conductor electrically connecting midpoint terminals of the second modules, and a third conductor electrically connecting midpoint terminals of the third modules. Semiconductor modules forming the first row have surfaces facing the second row and from which midpoint terminals protrude toward the second row. Semiconductor modules forming the second row have surfaces facing the second row and from which midpoint terminals protrude toward the first row. Each of the midpoint conductors extends in the first direction from a connected portion of a corresponding midpoint terminal toward a side of the power conversion device. The first modules and the second modules are disposed between the side of the power conversion device and the third modules in the first direction.

According to the disclosed power conversion device, the first modules forming the first-phase upper-and-lower arm circuit are disposed in the first row, and the second modules forming the second-phase upper-and-lower arm circuit are disposed in the second row. At least one of the third modules forming the third-phase upper-and-lower arm circuit is disposed in the first row, and the rest is disposed in the second row. The midpoint conductors can be all led out in the first direction rather than in a direction perpendicular to the first direction and the second direction. As a result, the power conversion device can be reduced in height.

Hereinafter, multiple embodiments will be described with reference to the drawings. Elements corresponding to each other among the embodiments are assigned the same numeral and their descriptions may be omitted. When only a part of a component is described in an embodiment, the other part of the component can be relied on the component of a preceding embodiment. Furthermore, in addition to the combination of components explicitly described in each embodiment, it is also possible to combine components from different embodiments, as long as the combination poses no difficulty, even if not explicitly described.

The power conversion devices of the present embodiments are each applied, for example, to a moving vehicle that uses a rotating electric machine as a driving source. The moving vehicle includes, for example, electric vehicles such as a battery electric vehicle (BEV), a hybrid electric vehicle (HEV), and a plug-in hybrid electric vehicle (PHEV), air vehicle such as a drone and an electric vertical takeoff and landing vehicle (eVTOL), ships, construction machinery, and agricultural machinery. An example where the power conversion device is applied to a vehicle will be described below.

First Embodiment

First, a schematic configuration of a vehicle drive system is described with reference to FIG. 1.

As illustrated in FIG. 1, a vehicle drive system 1 includes a DC power supply 2, a motor generator 3, and a power conversion device 4.

The DC power supply 2 is a DC voltage source formed of a chargeable/dischargeable secondary battery. Examples of the secondary battery include a lithium ion battery, a nickel-hydrogen battery, and an organic radical battery. The motor generator 3 is a three-phase AC rotating electric machine. The motor generator 3 functions as a traveling driving source of a vehicle, i.e., an electric motor. The motor generator 3 functions as a generator during regeneration. The power conversion device 4 performs power conversion between the DC power supply 2 and the motor generator 3.

FIG. 1 illustrates a circuit configuration of the power conversion device 4. The power conversion device 4 includes a power conversion circuit. The power conversion device 4 includes at least a power conversion circuit. The power conversion circuit of this embodiment is an inverter 5. The power conversion device 4 may further include a smoothing capacitor 6, a drive circuit 7, and the like.

The smoothing capacitor 6 mainly smooths DC voltage supplied from the DC power supply 2. The smoothing capacitor 6 is connected to a P line 8, a power line on the high potential side, and to an N line 9, a power line on the low potential side. The P line 8 is connected to the positive electrode of the DC power supply 2, and the N line 9 is connected to the negative electrode of the DC power supply 2. A positive electrode of the smoothing capacitor 6 is connected to the P line 8 between the DC power supply 2 and the inverter 5. A negative electrode of the smoothing capacitor 6 is connected to the N line 9 between the DC power supply 2 and the inverter 5. The smoothing capacitor 6 is connected in parallel to the DC power supply 2.

The inverter 5 is a DC-AC conversion circuit. The inverter 5 converts DC voltage into three-phase AC voltage according to switching control by an undepicted control circuit, and outputs the three-phase AC voltage to the motor generator 3. As a result, the motor generator 3 is driven to generate a predetermined torque. During regenerative braking of the vehicle, the inverter 5 converts the three-phase AC voltage, which is generated by the motor generator 3 under rotational force from wheels, into a DC voltage according to switching control by the control circuit, and outputs the DC voltage to the P line 8. In this way, the inverter 5 performs bidirectional power conversion between the DC power supply 2 and the motor generator 3.

The inverter 5 includes upper-and-lower arm circuits 10 for three phases. The upper-and-lower arm circuit 10 is sometimes referred to as a leg. Each upper-and-lower arm circuit 10 has an upper arm 10H and a lower arm 10L. The upper arm 10H and the lower arm 10L are connected in series between the P line 8 and the N line 9, with the upper arm 10H on the P line 8 side.

The connecting point between the upper arm 10H and the lower arm 10L, i.e., the midpoint of the upper-and-lower arm circuit 10, is connected to a winding 3a of a corresponding phase of the motor generator 3 via an output line 11. In the upper-and-lower arm circuit 10, the U-phase upper-and-lower arm circuit 10U is connected to the U-phase winding 3a via the output line 11. The V-phase upper-and-lower arm circuit 10V is connected to the V-phase winding 3a via the output line 11. The W-phase upper-and-lower arm circuit 10W is connected to the W-phase winding 3a via the output line 11.

In this embodiment, the upper-and-lower arm circuit 10 (10U, 10V, 10W) includes series circuits 12 connected in parallel to each other. Specifically, each upper-and-lower arm circuit 10 includes two series circuits 12. The two series circuits 12 are each provided between the P line 8 and the N line 9, and are connected in parallel to each other. The series circuit 12 is formed by connecting at least one switching element on the upper arm 10H side and at least one switching element on the lower arm 10L side in series between the P line 8 and the N line 9.

One series circuit 12 has two switching elements connected in parallel to each other on the P line 8 side (high side), and two switching elements connected in parallel to each other on the N line 9 side (low side). In other words, the four switching elements on the high side of the two series circuits 12 form the upper arm 10H for one phase, and the four switching elements on the low side form the lower arm 10L for one phase.

In this embodiment, an n-channel MOSFET 13 is used as each switching element. MOSFET is an abbreviation for Metal Oxide Semiconductor Field Effect Transistor. The four high-side MOSFETs 13 connected in parallel are on-driven or off-driven at the same timing by a common gate drive signal (drive voltage). The four low-side MOSFETs 13 connected in parallel are on-driven or off-driven at the same timing by a common gate drive signal (drive voltage).

A freewheeling diode 14 (hereinafter referred to as FWD 14) is connected in antiparallel to each of the MOSFETs 13. In the case of the MOSFET 13, the FWD 14 may be a parasitic diode (body diode) or an external diode. In the upper arm 10H, the drain of the MOSFET 13 is connected to the P line 8. In the upper arm 10L, the source of the MOSFET 13 is connected to the N line 9. The drain of the MOSFET 13 in the upper arm 10H and the drain of the MOSFET 13 in the lower arm 10L are connected to each other. The anode of the FWD 14 is connected to the source of the corresponding MOSFET 13, and the cathode thereof is connected to the drain of that MOSFET 13.

The switching element is not limited to the MOSFET 13. For example, IGBT may be used. IGBT is an abbreviation for Insulated Gate Bipolar Transistor. For the IGBT, the FWD14 is also connected in antiparallel. The number of the high-side switching elements and the number of the low-side switching elements forming the series circuit 12 are each not limited to two. The number may be one or three or more.

The drive circuit 7 drives the switching elements configuring the power conversion circuit such as the inverter 5. The drive circuit 7 supplies a drive voltage to the gate of a corresponding MOSFET 13 based on a drive command from the control circuit. By applying the drive voltage, the drive circuit drives, i.e., on-drives or off-drives the corresponding MOSFET 13. The drive circuit is sometimes referred to as a driver.

The power conversion device 4 may include the control circuit of the switching element. The control circuit generates the drive command for operating the MOSFET 13 and outputs the drive command to the drive circuit 7. The control circuit generates the drive command based on, for example, a torque request received from an undepicted host ECU or each of signals detected by various sensors. ECU is an abbreviation for Electronic Control Unit. The control circuit may be provided within the host ECU.

Examples of the sensors include a current sensor, a rotation angle sensor, and a voltage sensor. The power conversion device 4 may include at least one of the sensors. The current sensor detects a phase current flowing through the winding 3a of each phase. The rotation angle sensor detects a rotation angle of a rotor of the motor generator 3. The voltage sensor detects a voltage across the smoothing capacitor 6. The control circuit includes, for example, a processor and a memory. The control circuit outputs, for example, a PWM signal as the drive command. PWM is an abbreviation for Pulse Width Modulation.

The power conversion device 4 may include a converter as the power conversion circuit. The converter is a DC-DC conversion circuit that converts a DC voltage to a DC voltage having a different value. The converter is provided between the DC power supply 2 and the smoothing capacitor 6. The converter includes, for example, a reactor and the aforementioned upper-and-lower arm circuit 10. This configuration enables stepping up and stepping down of the voltage. The power conversion device 4 may include a filter capacitor that removes power-supply noise from the DC power supply 2. The filter capacitor is provided between DC power supply 2 and the converter.

Figure 2:
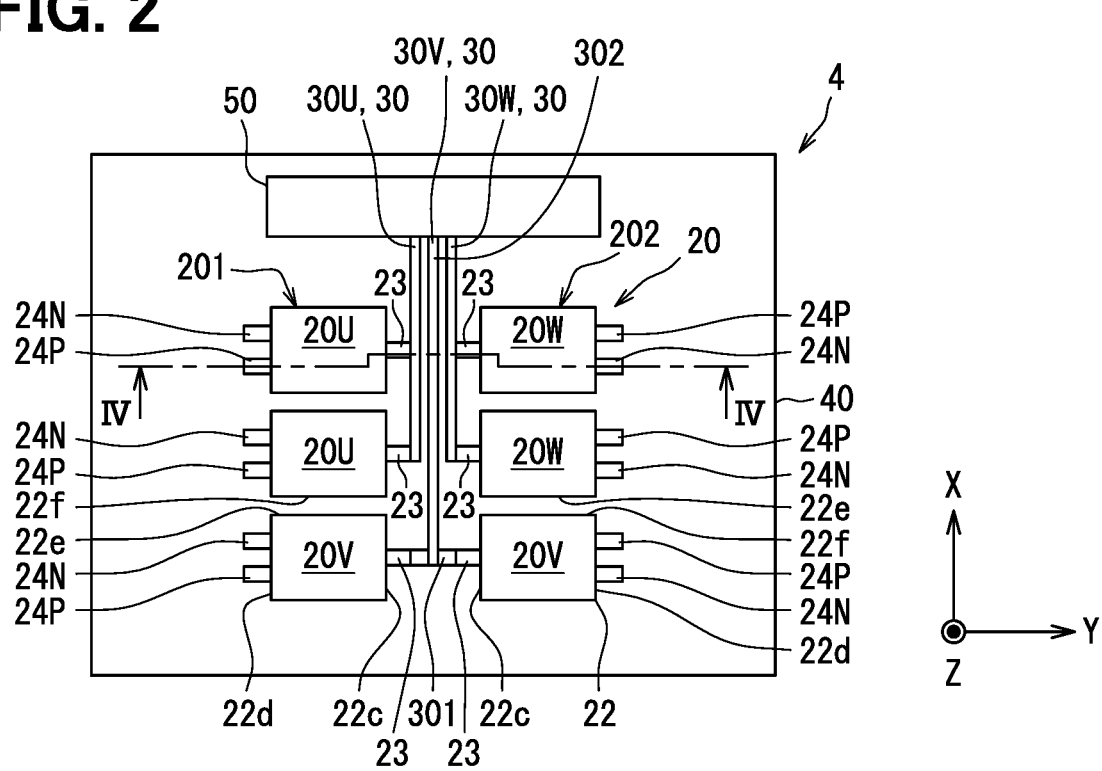
FIG. 2 is a planar view illustrating the power conversion device.

FIG. 2 is a planar view illustrating the power conversion device 4 of this embodiment. In FIG. 2, a case is illustrated in a simplified manner so as to see the inside of the case.

The power conversion device 4 of this embodiment includes multiple semiconductor modules 20 and multiple output conductors 30. The power conversion device 4 may include the case 40 as illustrated in FIG. 2. The case 40 houses other elements forming the power conversion device 4. The case 40 is, for example, formed by aluminum die-casting. The case 40 has an opening to house other elements. The power conversion device 4 may include a cover (lid) to close the opening of the case 40, in addition to the case 40. The case 40 and the cover are sometimes referred to as a housing.

The power conversion device 4 may include the current sensor 50 as illustrated in FIG. 2. The current sensor 50 detects phase current. The current sensor 50 is disposed within the case 40.

Hereinafter, the direction, in which the semiconductor modules 20 forms an row, is referred to as an X direction. A direction, perpendicular to the X direction and in which the semiconductor modules 20 (20V) forming the V-phase upper-and-lower arm circuit 10V are arranged, is referred to as a Y direction. The direction perpendicular to both the X direction and the Y direction is referred to as a Z direction. The X direction, Y direction, and Z direction are in a positional relationship where they are perpendicular to each other. The X direction corresponds to a first direction, the Y direction corresponds to a second direction, and the Z direction corresponds to a third direction.

Figure 3:
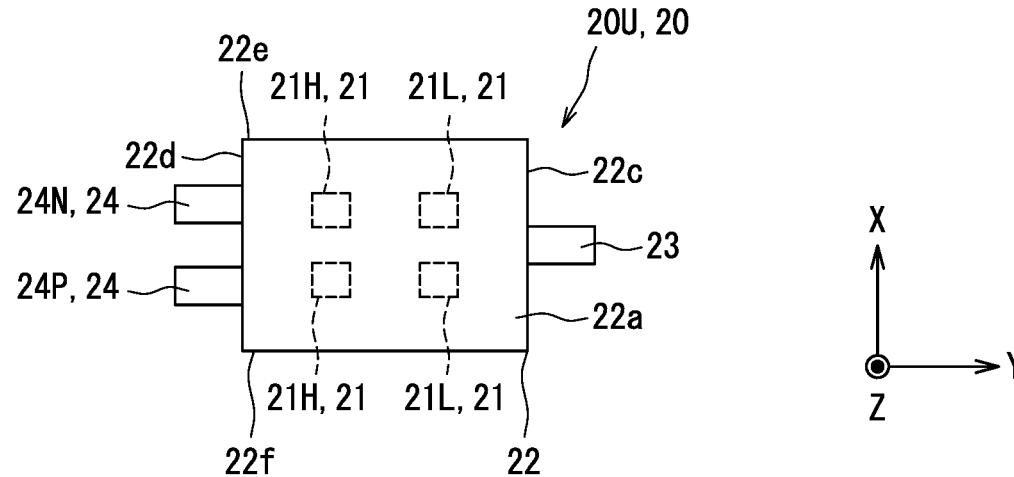
FIG. 3 is a planar view illustrating a semiconductor module.
Figure 4:
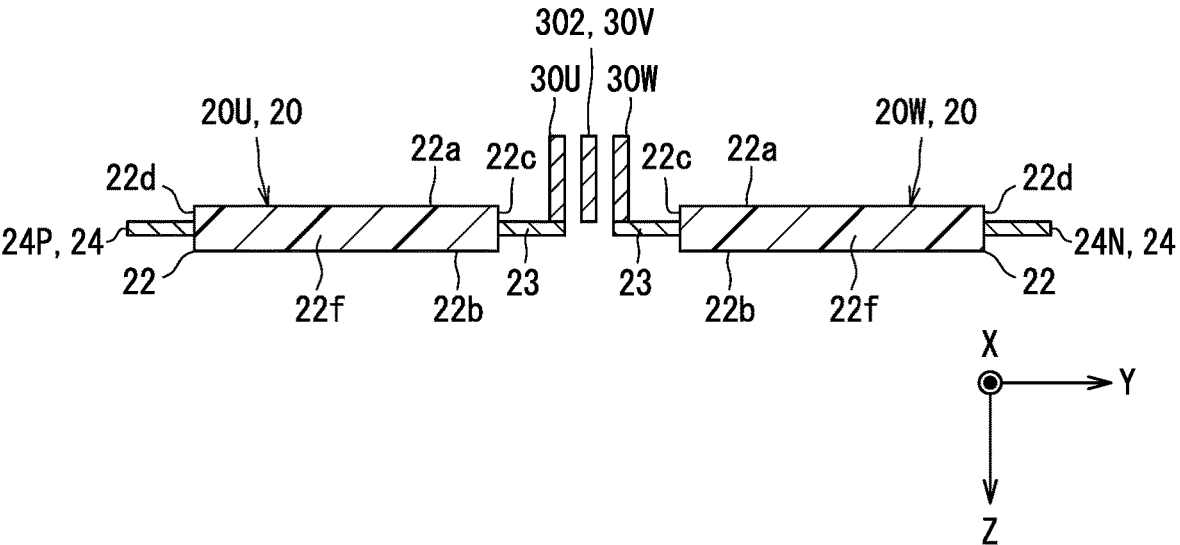
FIG. 4 is a cross sectional diagram taken along the line IV-IV in FIG. 2.

FIG. 3 is a planar view illustrating a semiconductor module 20. FIG. 3 exemplarily shows the semiconductor module 20 forming the U-phase upper-and-lower arm circuit 10U. FIG. 4 is a cross sectional diagram along the line IV-IV in FIG. 2. In FIG. 4, elements disposed within a sealing body are omitted for convenience. The case 40 and the current sensor 50 are also omitted.

The semiconductor modules 20 form the aforementioned upper-and-lower arm circuit 10, i.e., the inverter 5 (power conversion circuit). In this embodiment, one semiconductor module 20 provides one series circuit 12. The multiple semiconductor modules 20 include two semiconductor modules 20U, two semiconductor modules 20V, and two semiconductor modules 20W. The two semiconductor modules 20U form the U-phase upper-and-lower arm circuit 10U. The two semiconductor modules 20V form the V-phase upper-and-lower arm circuit 10V. The two semiconductor modules 20W form the W-phase upper-and-lower arm circuit 10W.

All the semiconductor modules 20 have a common structure. As illustrated in FIGS. 2, 3, and 4, each semiconductor module 20 includes semiconductor elements 21, a sealing body 22, an output terminal 23, and power terminals 24.

The semiconductor element 21 includes a switching element formed on a semiconductor substrate made of silicon (Si), a wide bandgap semiconductor having a wider bandgap than silicon, or the like. The switching element has a vertical structure such that main current flows in a thickness direction of the semiconductor substrate. Examples of the wide bandgap semiconductor include silicon carbide (SiC), gallium nitride (GaN), gallium oxide (Ga2O3), and diamond. The semiconductor element 21 is sometimes referred to as a power element, a semiconductor chip and the like.

The semiconductor element 21 of this embodiment includes the aforementioned n-channel MOSFET 13 and the FWD 14 formed on the semiconductor substrate made of SiC. The MOSFET 13 has a vertical structure such that the main current flows in the thickness direction of the semiconductor element 21 (semiconductor substrate). The semiconductor element 21 has undepicted main electrodes on the two sides in the thickness direction thereof. Specifically, the semiconductor element 21 has a source electrode on its surface and a drain electrode on its back, as the main electrodes of the switching element. The source electrode is formed on a portion of the front surface. The drain electrode is formed on almost the entire back.

The main current flows between the drain electrode and the source electrode. The semiconductor element 21 has an undepicted pad as a signal electrode on the forming surface of the source electrode. The semiconductor element 21 is disposed such that its thickness direction is substantially parallel to the Z direction. The semiconductor elements 21 of this embodiment include semiconductor element 21H that provides switching elements on the high side of the series circuit 12 and the semiconductor element 21L that provides switching elements on the low side of the series circuit 12. The semiconductor elements 21H and 21L are arranged side by side in the Y direction. The semiconductor element 21 includes two semiconductor elements 21H and two semiconductor elements 21L. The two semiconductor elements 21H are arranged side by side in the X direction. Similarly, the two semiconductor elements 21L are arranged side by side in the X direction.

The four semiconductor elements 21 provide four switching elements of one series circuit 12. The semiconductor module 20 includes the semiconductor elements 21 in the number corresponding to the number of switching elements configuring one series circuit 12. In the case of the two switching elements configuring the series circuit 12, the semiconductor module 20 includes one each of the semiconductor elements 21H and 21L.

The sealing body 22 seals some of other elements configuring the semiconductor module 20. The rest of other elements are exposed outside of the sealing body 22. The sealing body 22 is made of resin, for example. The sealing body 22 is molded by a transfer mold method, using, for example, epoxy resin as a material. The sealing body 22 may be formed of gel, for example.

The sealing body 22 has, for example, a substantially rectangular shape in planar view. The sealing body 22 has one side 22a and a back 22b opposite to the side 22a in the Z direction, as surfaces forming its outline. The side 22a and the back 22b are each a flat surface, for example. The sealing body 22 further has side surfaces 22c, 22d, 22e, and 22f that connect the side 22a and the back 22b. The side surface 22c is opposite to the side 22d in the Y direction. The side surface 22e is opposite to the side 22f in the X direction.

The output terminal 23 and the power terminal 24 are each an external connection terminal electrically connected to the main electrode of the semiconductor element 21. The output terminal 23 and the power terminal 24 are each sometimes referred to as a main terminal. The output terminal 23 is electrically connected to a connection point between the source electrode of the semiconductor element 21H and the drain electrode of the semiconductor element 21L, i.e., the connection point of the series circuit 12. The output terminal 23 corresponds to a midpoint terminal. The power terminal 24 include a P terminal 24P, an N terminal 24N. The P terminal 24P is electrically connected to the drain electrode of the semiconductor element 21H. The N terminal 24N is electrically connected to the source electrode of the semiconductor element 21L.

The output terminal 23, the P terminal 24P, and the N terminal 24N each have a portion extending in the Y direction. The output terminal 23 extends to a side opposite to the power terminal 24 in the Y direction. The output terminal 23 protrudes outward from the side surface 22c of the sealing body 22 as described above. The protruding portion of the output terminal 23 includes a portion with a plate thickness direction being roughly parallel to the Z direction. The P terminal 24P and the N terminal 24N, each being the power terminal 24, protrude to the outside from the side surface 22d of the sealing body 22. The protruding portion of the P terminal 24P and the protruding portion of the N terminal 24N are arranged in the X direction.

The number of the output terminals 23, the number of the P terminals 24P, and the number of the N terminals 24N of one semiconductor module 20 are each not limited. The numbers may be one each, or at least one of those may be two or more. For example, the output terminals 23, the P terminals 24P, and the N terminals 24N may be provided two for each. To suppress current deviation between the semiconductor elements 21 connected in parallel, the terminals should be symmetrically disposed with respect to the semiconductor elements 21 connected in parallel. In this embodiment, the output terminal 23, the P terminal 24P, and the N terminal 24N are shown one for each for convenience.

In addition to the aforementioned elements, the semiconductor module 20 includes a wiring component and a signal terminal (not shown). The wiring components provide a wiring function to electrically connect the main electrodes and the main terminals of the semiconductor element 21. The wiring component also provides a heat radiation function that radiates heat from the semiconductor element 21 to the outside of semiconductor module 20. The wiring components are disposed so as to sandwich the semiconductor element 21 in the Z direction, for example. The wiring components may each include a substrate including metal bodies disposed on respective two sides of an insulating substrate, or a heat sink being a metal component. The heat sink is provided as part of a lead frame, for example. Heat dissipation can be increased by exposing part of the wiring component from the one side 22a and/or the back 22b of the sealing body 22.

The signal terminal is an external connection terminal electrically connected to the pad of the semiconductor element 21. The signal terminal also protrudes from the sealing body 22 to the outside. For example, the signal terminal connected to the pad of the semiconductor element 21H protrudes from the side surface 22d of the sealing body 22. The signal terminal connected to the pad of the semiconductor element 21L protrudes from the side surface 22c of the sealing body 22. The external connection terminals do not protrude from the side surface 22e or 22f of the sealing body 22.

As illustrated in FIG. 2, the six semiconductor modules 20 are arranged in two rows of three each. The two semiconductor modules 20U forming the U-phase upper-and-lower arm circuit 10U are successively arranged in the X direction to form the first row 201. The two semiconductor modules 20W forming the W-phase upper-and-lower arm circuit 10W are successively arranged in the X direction to form the second row 202. The semiconductor modules 20W is disposed so as to face the semiconductor modules 20U in the Y direction. The two semiconductor modules 20V forming the V-phase upper-and-lower arm circuit 10V are arranged in the Y direction. One of the semiconductor modules 20V forms the first row 201, and the other one forms the second row 202.

In this way, only the semiconductor modules 20V are arranged side by side in the Y direction, and the respective semiconductor modules 20U and 20W are arranged side by side in the X direction. The three semiconductor modules 20 forming the first row 201 are arranged in the order of the semiconductor module 20U, the semiconductor module 20U, and the semiconductor module 20V. The three semiconductor modules 20 forming the second row 202 are arranged in the order of the semiconductor module 20W, the semiconductor module 20W, and the semiconductor module 20V.

If two semiconductor modules 20 of a common phase are regarded as one piece, the six semiconductor modules 20 form a roughly U shape in planar view in the Z direction. The U phase, the W phase, and the V phase correspond to a first phase, a second phase, and a third phase, respectively. The semiconductor modules 20U, 20W, and 20V correspond to first, second, and third modules, respectively.

The semiconductor modules 20 forming the first row 201 and the semiconductor modules 20 forming the second row 202 are disposed so that their side surfaces 22c face each other with a predetermined space therebetween. The semiconductor modules 20 forming the second row 202 are set in a position corresponding to a position as a result of rotating the semiconductor modules 20 forming the first row 201 by 180 degrees around the Z-axis. The output terminals 23 of the semiconductor modules 20 forming the first row 201 protrude from the side surfaces 22c being surfaces facing the second row 202. The output terminals 23 of the semiconductor modules 20 forming the second row 202 protrude from the side surfaces 22c being surfaces facing the first row 201. In other words, every output terminal 23 protrudes from the inner side surface. Every power terminal 24 protrudes from the outer side surface.

In the first row 201, the side surface 22f of the semiconductor module 20U located at the end in the X direction and the side surface 22e of the semiconductor module 20U located in the middle face each other with a predetermined distance therebetween. The side surface 22f of the semiconductor module 20U located in the middle and the side surface 22e of the semiconductor module 20V located at the end in the X direction face each other with a predetermined distance therebetween. In the second row 202, the side surface 22e of the semiconductor module 20W located at the end in the X direction and the side surface 22f of the semiconductor module 20W located in the middle face each other with a predetermined distance therebetween. The side surface 22e of the semiconductor module 20W located in the middle and the side surface 22f of the semiconductor module 20V located at the end in the X direction face each other with a predetermined distance therebetween. The distance between the semiconductor modules 20 adjacent in the X direction is narrower than the distance between the semiconductor modules 20 adjacent in the Y direction.

As illustrated in FIG. 2, the output conductors 30 are wiring components electrically connected to the output terminals 23 of the semiconductor modules 20. The output conductor 30 electrically connects between the output terminals 23 of a corresponding phase. The output conductor 30 connects the semiconductor modules 20 of a corresponding phase in parallel. The output conductor 30 forms part of the above output line 11. The output conductor 30 is provided, for example, in a form of a plate-shaped metal component. The output conductor 30 is sometimes referred to as a bus bar. The output conductor 30 corresponds to a midpoint conductor. The output conductor 30 is connected to the corresponding output terminal 23 by soldering, resistance welding, laser welding, or the like.

The output conductors 30 include an output conductor 30U, an output conductor 30V, and an output conductor 30W. The output conductor 30U electrically connects between the output terminals 23 of the two semiconductor modules 20U. The output conductor 30U has a portion extending in the X direction. The output conductor 30U electrically connects between the two U-phase output terminals 23 arranged in the X direction. The output conductor 30W electrically connects between the output terminals 23 of the two semiconductor modules 20W. The output conductor 30W has a portion extending in the X direction. The output conductor 30W electrically connects between the two W-phase output terminals 23 arranged in the X direction. The output conductor 30W has a predetermined distance from the output conductor 30U in the Y direction.

The output conductor 30V electrically connects between the output terminals 23 of the two semiconductor modules 20V. The output conductor 30V has a connected portion 301 and an extending part 302. The connected portion 301 includes a portion extending in the Y direction to electrically connect between the output terminals 23. The extending part 302 extends from the connected portion 301 in the X direction. The output conductors 30U, 30W, and 30V correspond to first, second, and third conductors, respectively.

Each of the output conductors 30 (30U, 30V, 30W) extends in the X direction from the connected portion of the corresponding output terminal 23 to a side of the power conversion device 4, the semiconductor modules 20U and 20W are disposed between the side of the power conversion device 4 and the semiconductor modules 20V in the X direction. In other words, the output conductor 30 extends in the direction away from the semiconductor module 20V. The extending part 302 of the output conductor 30V is disposed between the output conductors 30U and 30W in the Y direction. The three output conductors 30 are arranged in the order of the output conductor 30U, the output conductor 30V, and the output conductor 30W in the Y direction. The output conductor 30W is led out from a gap between the output conductors 30U and 30V. The current sensor 50 is disposed at a location corresponding to the extended ends of the output conductor 30. This makes it possible to shorten the length of the output conductor 30 to the current sensor 50. The current sensor 50 is arranged in the X direction with respect to the semiconductor modules 20. The current sensor 50 is provided in the middle of the output conductor 30 and detects the phase current.

As illustrated in FIG. 4, the output conductors 30 in this embodiment are disposed so that their plate surfaces face each other in the extending parts in the X direction. The thickness direction of each output conductor 30 is roughly parallel to the Y direction. In other words, the plate width direction perpendicular to the extending direction is roughly parallel to the Z direction. Between the plate surfaces of the output conductor 30V (the extending part 302), one side faces the plate surface of the output conductor 30U, and the back side faces the plate surface of the output conductor 30W. The three output conductors 30 are arranged at predetermined distances.

As described above, in this embodiment, the six semiconductor modules 20 are arranged in two rows of three each. The two semiconductor modules 20U (first module) forming the U-phase upper-and-lower arm circuit 10U are disposed in the first row 201. The two semiconductor modules 20W (second module) forming the W-phase upper-and-lower arm circuit 10W are disposed in the second row 202. One of the two semiconductor modules 20V (third modules) configuring the V-phase upper-and-lower arm circuit 10V is disposed in the first row 201, and the other one is disposed in the second row 202. In other words, only the semiconductor modules 20V are arranged side by side in the Y direction, and the semiconductor modules 20U and 20W are each arranged side by side in the X direction.

As a result, while the common-phase output terminals 23 (midpoint terminal) are electrically connected by the output conductor 30, the connection structure between the semiconductor module 20 and the output conductor 30 (midpoint conductor) forms a roughly U-shape. In the X direction, one end of the connection structure is closed by the semiconductor module 20V and part of the output conductor 30V (third conductor), and the other end is an open end. The output conductors 30U, 30V, and 30W therefore can be led out toward the open end in the X direction. The output conductor 30 can be drawn out in the same direction on the XY plane. Since it is not necessary to lead out the output conductors in the Z direction unlike in the traditional case, the power conversion device 4 can be reduced in size in the Z direction, i.e., reduced in height.

Positional relationships between the output conductors 30U, 30V, and 30W are not limited. In this embodiment, an extending part 302 of the output conductor 30V (third conductor) is disposed between the output conductor 30U (first conductor) and the output conductor 30W (second conductor) in the Y direction. The output conductor 30U can be disposed near the semiconductor modules 20U arranged in the X direction in the first row 201, and the output conductor 30W can be disposed near the semiconductor modules 20W arranged in the X direction in the second row 202. As a result, the extending part 302 of the output conductor 30V can be drawn out through a gap between the output conductors 30U and 30W. Consequently, the power conversion device 4 can be further reduced in height.

In a configuration where the extending part 302 is disposed between the output conductors 30U and 30W, it may be disposed so that the side surfaces face each other, for example. In this case, since the output conductors 30U, 30V, and 30W are arranged side by side in a plate width direction, the first row 201 and the second row 202 must be made away from each other. This may increase size in the Y direction of the power conversion device 4. The output conductors 30U, 30V, and 30W in this embodiment are disposed so that their plate surfaces face each other in the Y direction. As a result, it is possible to shorten a facing distance between the first row 201 and the second row 202, and in turn reduce the size in the Y direction of the power conversion device 4.

The protruding position of the power terminal 24 is not limited. For example, the power terminal 24 may protrude from the same surface (side surface 22c) as the surface for the output terminal 23. The power terminal 24 in this embodiment protrudes from the surface (side surface 22d) opposite to that for the output terminal 23. This eliminates the need for wiring to bypass the power terminals 24 and a power conductor 31, making it possible to simplify lead-out of the output conductors 30.

The arrangement of the six semiconductor modules 20 is not limited to the above exemplary case. Position of the semiconductor module 20 may be replaced. For example, instead of the semiconductor modules 20V, the semiconductor modules 20U may be arranged in the Y direction. In this case, the U phase corresponds to the third phase, the semiconductor module 20U corresponds to the third module, and the output conductor 30U corresponds to the third conductor. One of the semiconductor modules 20V and 20W is a first module, and the other is a second module. Instead of the semiconductor module 20V, the semiconductor module 20W may be arranged in the Y direction. In this case, the W phase corresponds to the third phase, the semiconductor module 20W corresponds to the third module, and the output conductor 30W corresponds to the third conductor. One of the semiconductor modules 20U and 20V is a first module, and the other is a second module.

The number of series circuits 12 configuring the upper-and-lower arm circuit 10 for one phase, i.e., the number of semiconductor modules 20 of each phase is not limited to two. The number may be an even number of four or more. For example, when the number is four, the first row 201 includes four semiconductor modules 20U arranged in a row and two semiconductor modules 20V arranged in a row. The second row 202 includes four semiconductor modules 20W arranged in a row and two semiconductor modules 20V arranged in a row.

An example, where a portion, in which the plate surfaces of the output conductors 30 face each other, is disposed above the output terminals 23 in the Z direction, has been non-exclusively given. The portion may be disposed below the output terminals 23.

Second Embodiment

A second embodiment is a modification based on the preceding embodiment, where description of the preceding embodiment can be used as reference.

Figure 5:
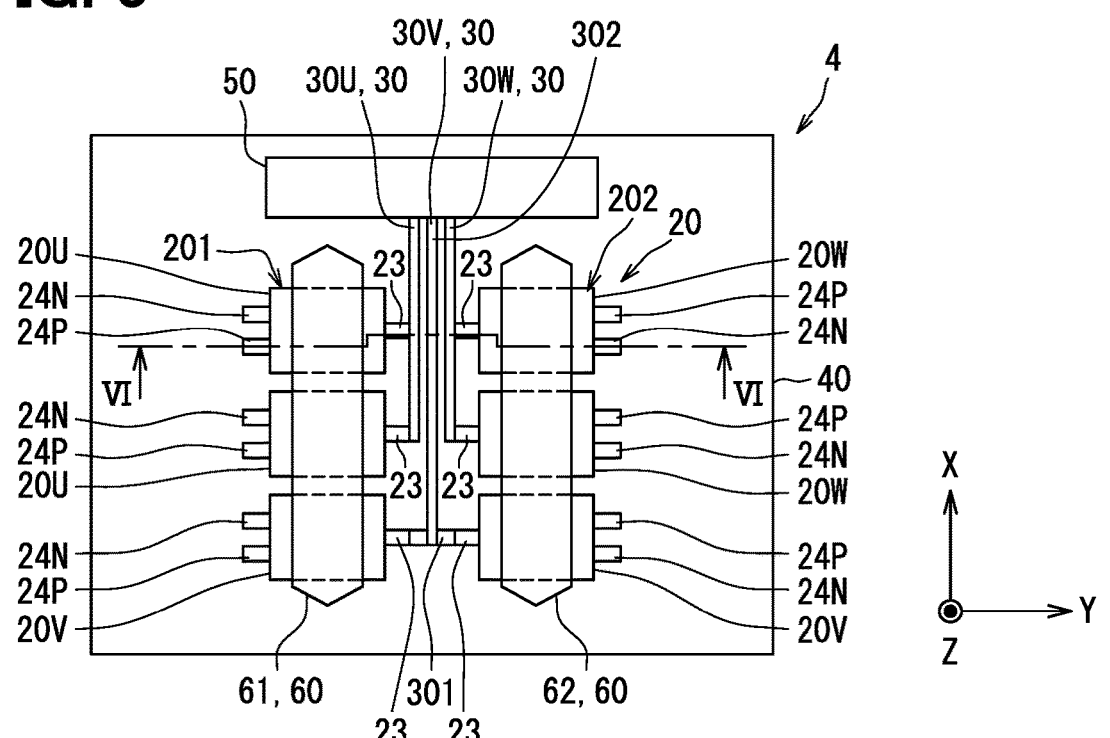
FIG. 5 is a planar view illustrating the power conversion device according to a second embodiment.
Figure 6:
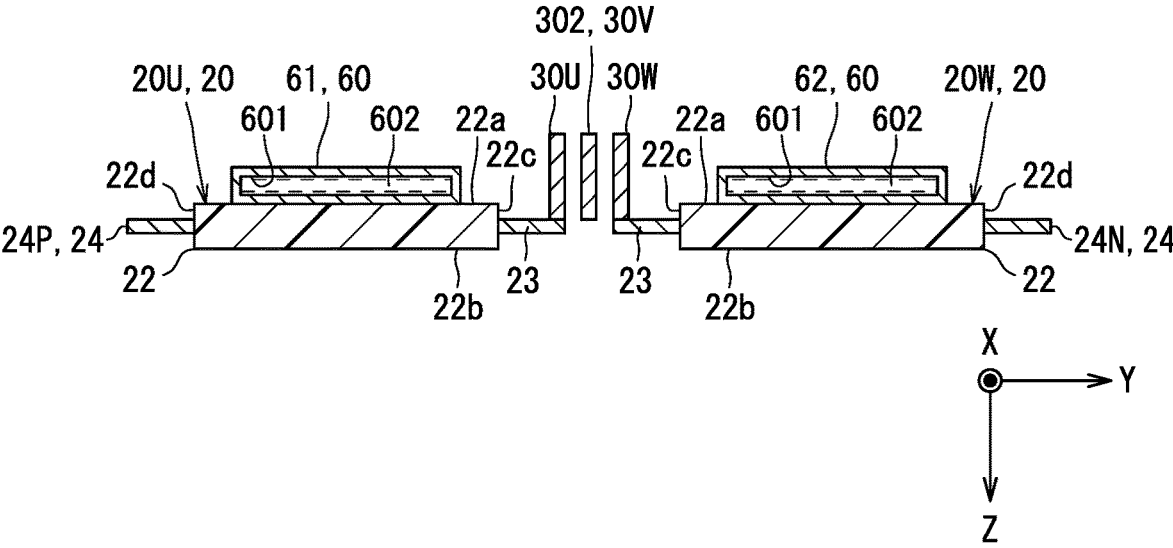
FIG. 6 is a cross sectional diagram taken along the line VI-VI in FIG. 5.

FIG. 5 is a planar view illustrating the power conversion device 4 of this embodiment. FIG. 6 is a cross sectional diagram along the line VI-VI in FIG. 5. In FIG. 6, elements disposed within the sealing body 22 are omitted for convenience. The case 40 and the current sensor 50 are also omitted. In this embodiment, a cooler 60 is added to the configuration described in the preceding embodiment. In other words, the power conversion device 4 further includes the cooler 60. The configuration of this embodiment is the same as the configuration described in the preceding embodiment except for the cooler 60.

The cooler 60 is made of a metal material with excellent thermal conductivity, such as aluminum-based material, for example. The cooler 60 has a flow path 601 inside. A refrigerant 602 is supplied into the flow path 601 of the cooler 60 via an undepicted introduction pipe. Further, the refrigerant 602 that has flowed through the flow path 601 of the cooler 60 is discharged via an undepicted discharge pipe. A phase-change refrigerant such as water or ammonia or a non-phase-change refrigerant such as an ethylene glycol-based refrigerant can be used as the refrigerant 602.

The cooler 60 is disposed to cool the semiconductor modules 20. Although the cooler 60 may be appropriately disposed without limitation with respect to the semiconductor module 20, in the case of the semiconductor element 21 with the aforementioned vertical structure, the cooler 60 should be disposed in the Z direction in the semiconductor module 20. The cooler 60 in this embodiment is disposed to cool each semiconductor module 20 from the Z direction. The cooler 60 is stacked on the semiconductor module 20. An electrically insulating component such as a ceramic plate is disposed between the cooler 60 and the semiconductor module 20, if necessary.

The cooler 60 may be disposed on the one side 22_a_ of the sealing body 22 in the Z direction, or may be disposed on the back side 22_b_. The cooler 60 may be disposed on both the one side 22_a_ and the back side 22_b_. The cooler 60 in this embodiment is disposed on the one side 22_a_ of the sealing body 22.

The coolers 60 may be provided in the same number as the semiconductor modules 20 so as to cool the semiconductor modules 20 individually. The cooler 60 may be provided to cool the multiple semiconductor modules 20 together. For example, the cooler 60 may be provided for each of the semiconductor modules 20 adjacent in the Y direction. All the semiconductor modules 20 may be cooled by one cooler 60. The cooler 60 in this embodiment includes a cooler 61 and a cooler 62 provided separately from the cooler 61.

The cooler 61 is extended in the X-direction. The cooler 61 is provided to collectively cool the three semiconductor modules 20 in the first row 201. The cooler 61 is provided so as to overlap each of the three semiconductor modules 20 in planar view in the Z direction. In the cooler 61, the refrigerant flows in the X direction. The cooler 62 is also extended in the X-direction. The cooler 61 is provided to collectively cool the three semiconductor modules 20 in the second row 202. The cooler 62 is provided so as to overlap each of the three semiconductor modules 20 in planar view in the Z direction. In the cooler 62, the refrigerant flows in the X direction. The cooler 61 corresponds to a first cooler, and the cooler 62 corresponds to a second cooler.

The power conversion device 4 of this embodiment includes the cooler 60. The cooler 60 can cool the semiconductor module 20 (semiconductor element 21). In particular, the cooler 60 is stacked on the semiconductor module 20 in the Z direction. As a result, the semiconductor module 20 can be effectively cooled.

In this embodiment, the cooler 60 is disposed to collectively cool the semiconductor modules 20 in each row. Specifically, the cooler 60 is disposed to collectively cool the three semiconductor modules 20 in the first row 201. In addition, the cooler 60 is disposed to collectively cool the three semiconductor modules 20 in the second row 202. This makes it possible to reduce the number of components compared to a configuration where coolers are provided and stacked individually for the semiconductor modules 20. As a result, the number of assembly steps can also be reduced.

In order to collectively cool the semiconductor modules 20, the cooler 60 may be provided so as to overlap all the semiconductor modules 20 in planar view in the Z direction. In this case, wiring of the output conductor 30 and the power conductor 31 described later is complicated. Further, when the output conductors 30 are disposed so that the plate surfaces thereof face each other, the cooler 60 must be provided so as to avoid contact with the output conductors 30, resulting in a complicated structure of the cooler 60. The same applies to the case where the cooler 60 is provided for each of the semiconductor modules 20 adjacent in the Y direction.

The power conversion device 4 of this embodiment includes the cooler 61 that collectively cools all the semiconductor modules 20 forming the first row 201, and the cooler 62 that collectively cools all the semiconductor modules 20 forming the second row 202. Consequently, wiring of the output conductors 30 and the power conductor 31 can be simplified. Moreover, as illustrated in FIG. 5, it is possible to prevent interference (contact) with the output conductors 30 disposed so that the plate surfaces face each other. This makes it possible to simplify the structure of the cooler 60 (61,62), and reduce height of the power conversion device 4.

The configuration described in this embodiment can be combined with any configuration in the first embodiment.

An example, where the cooler 61 and the cooler 62 are disposed on the one side 22_a_, has been non-exclusively given. The coolers may be disposed on the back side 22_b_.

Third Embodiment

A third embodiment is a modification based on the preceding embodiment, where description of the preceding embodiment can be used as reference.

Figure 7:
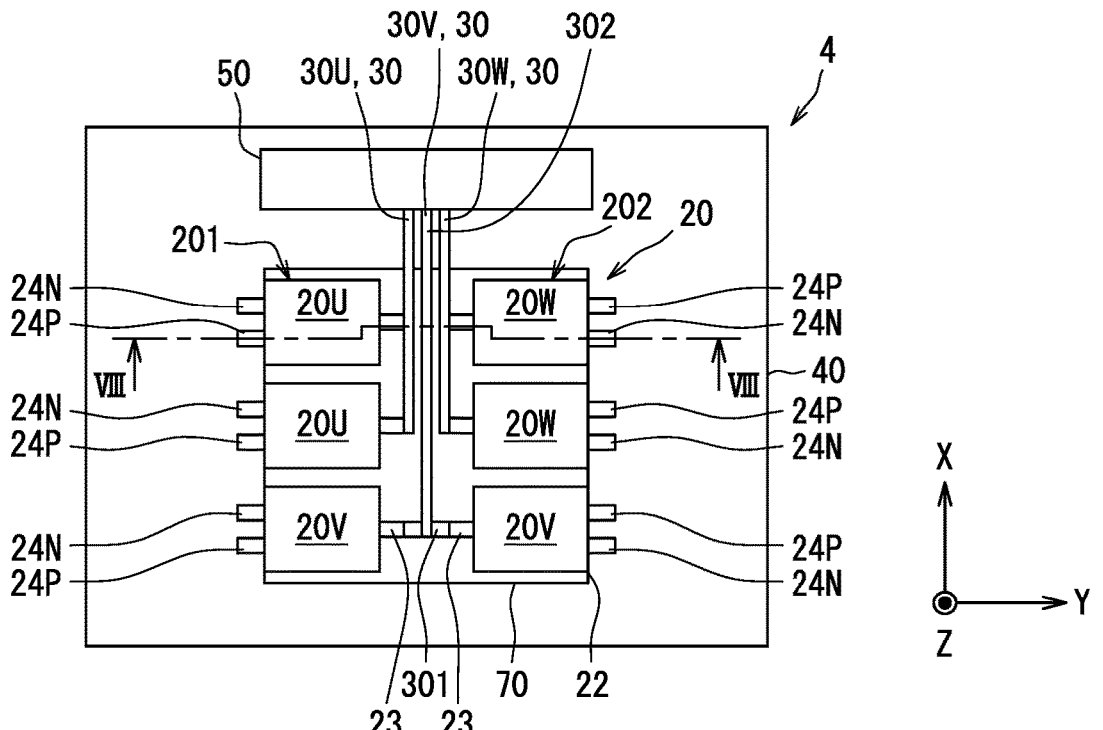
FIG. 7 is a planar view illustrating the power conversion device according to a third embodiment.
Figure 8:
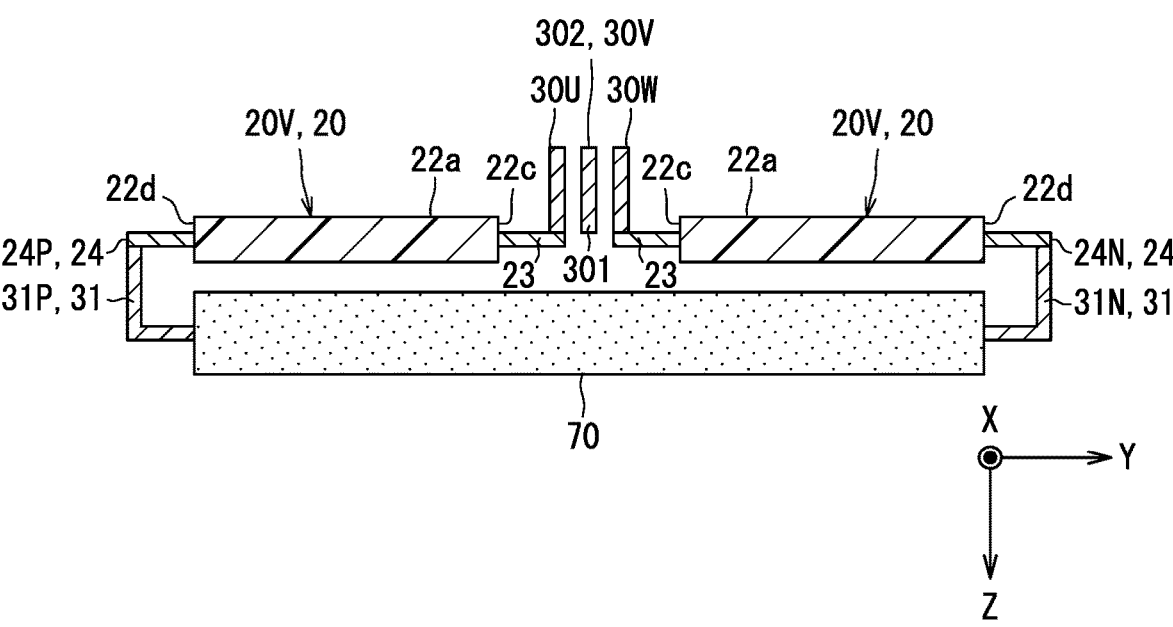
FIG. 8 is a cross sectional diagram taken along the line VIII-VIII in FIG. 7.

FIG. 7 is a planar view illustrating the power conversion device 4 of this embodiment. FIG. 8 is a side view seen from the X direction shown in FIG. 7. In FIG. 8, elements disposed within the sealing body 22 are omitted for convenience. The case 40 and the current sensor 50 are also omitted. FIGS. 7 and 8 illustrate a capacitor 70 in a simplified manner.

In this embodiment, the power conductor 31 and the capacitor 70 are added to the configuration described in the first embodiment. In other words, the power conversion device 4 further includes the power conductor 31 and the capacitor 70. The configuration of this embodiment is the same as the configuration described in the first embodiment except for the power conductor 31 and the capacitor 70.

The capacitor 70 provides the aforementioned smoothing capacitor 6. The capacitor 70 includes, for example, an undepicted case and a capacitor element housed in the case. The power conductor 31 is a wiring component that electrically connects the capacitor 70 and the power terminal 24 of the semiconductor module 20. The power conductor 31 is provided, for example, in a form of a plate-shaped metal component. The power conductor 31 is sometimes referred to as a power bus bar. The power conductor 31 is connected to the corresponding power terminal 24 by soldering, resistance welding, laser welding, or the like.

The power conductor 31 includes a positive electrode conductor 31P and a negative electrode conductor 31N. The positive electrode conductor 31P electrically connects the positive electrode of the capacitor 70 and the P terminal 24P of the semiconductor module 20. The positive electrode conductor 31P is sometimes referred to as a positive electrode bus bar, and P bus bar. The positive electrode conductor 31P forms at least part of the P line 8. The negative electrode conductor 31N electrically connects the negative electrode of the capacitor 70 and the N terminal 24N of the semiconductor module 20. The negative electrode conductor 31N is sometimes referred to as a negative electrode bus bar, and N bus bar. The negative electrode conductor 31N forms at least part of the N line 9.

FIG. 8 shows a terminal part of the power conductor 31 for connection to a corresponding power terminal 24. The terminal part of the positive electrode conductor 31P and the terminal part of the negative electrode conductor 31N are provided in correspondence to the P terminal 24P and the N terminal 24N, respectively, protruding from the side surfaces 22d of the first row 201 and in correspondence to the P terminal 24P and the N terminal 24N, respectively, protruding from the side surfaces 22d of the second row 202. In other words, the terminal part of the positive electrode conductor 31P and the terminal part of the negative electrode conductor 31N are provided on both end sides, respectively, in the Y direction. At least part of each of undepicted portions of the positive electrode conductor 31P and the negative electrode conductor 31N may be disposed so that such parts face each other. This makes it possible to reduce inductance.

The capacitor 70 is disposed with respect to the semiconductor module 20 without limitation. For example, the capacitor 70 may be disposed side by side with the semiconductor module 20 in the XY plane. In this embodiment, the capacitor 70 is disposed so as to overlap at least part of each of the semiconductor modules 20 in planar view in the Z direction. The capacitor 70 is arranged side by side with the semiconductor modules 20 in the Z direction. The capacitor 70 may be disposed, for example, so as to overlap at least part of each of the semiconductor modules 20. The capacitor 70 may be disposed on the side of the one side 22a of the sealing body 22 in the Z direction, or may be disposed on the back side 22b side. In this embodiment, the capacitor 70 is disposed on the back side 22b side.

The power conversion device 4 of this embodiment includes the power conductor 31 and the capacitor 70, making it possible to reduce the number of parts compared to a configuration with the capacitor 70 as a separate component.

The capacitor 70 in this embodiment is disposed so as to overlap at least part of each of the semiconductor modules 20 in planar view in the Z direction. Consequently, in a configuration where the multiple semiconductor modules 20 are arranged in two rows, the output terminals 23 protrude from the inner side surfaces, and the power terminals 24 protrude from the outer side surfaces, all the power terminals 24 are located near the capacitor 70. The power conductor 31 is therefore easily wired. In addition, it is possible to shorten the length of the power conductor 31 and thus reduce inductance. In the configuration including the capacitor 70, it is also possible to reduce size in the direction perpendicular to the Z direction.

The configuration described in this embodiment can be combined with each of the configurations of the first and second embodiments.

Fourth Embodiment

A fourth embodiment is a modification based on the preceding embodiment, where description of the preceding embodiment can be used as reference.

Figure 9:
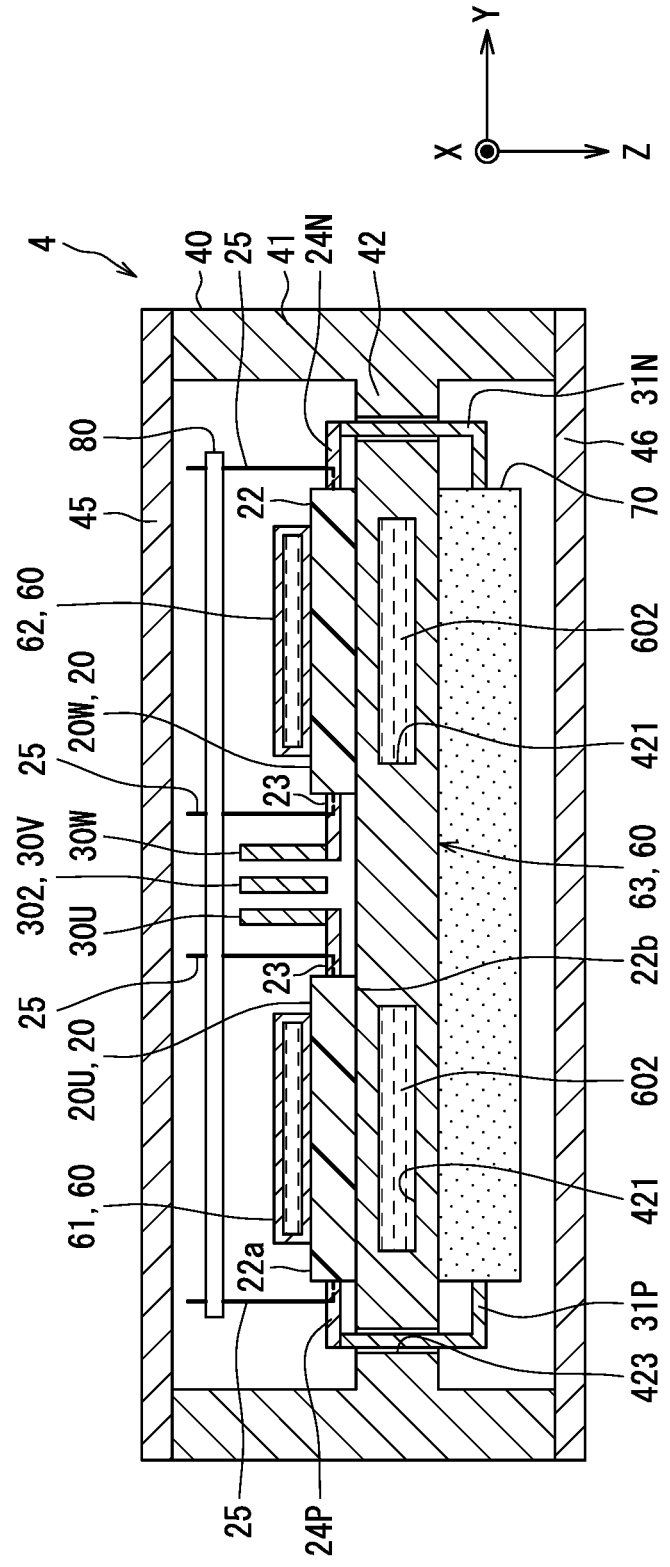
FIG. 9 is a cross sectional diagram illustrating the power conversion device according to a fourth embodiment.

FIG. 9 is a cross sectional diagram illustrating the power conversion device 4 of this embodiment. FIG. 9 corresponds to FIG. 8. In FIG. 9, elements disposed within the sealing body 22 and the current sensor 50 are omitted for convenience. Further, the capacitor 70 is illustrated in a simplified manner.

The power conversion device 4 of this embodiment has a configuration as a combination of the second and third embodiments. In other words, the power conversion device 4 further includes the power conductor 31, the cooler 60, and the capacitor 70 in addition to the configuration described in the first embodiment. Furthermore, the cooler 60 is provided using the case 40.

The case 40 houses other elements forming the power conversion device 4. The case 40 in this embodiment has the side wall 41 and the partition wall 42. The side wall 41 has a cylindrical shape extending in the Z direction. The side wall 41 has a roughly rectangular shape in planar view from the Z direction, for example. The partition wall 42 is provided inside the side wall 41. The partition wall 42 continues to the inner surface of the side wall 41 so as to divide a housing space within the side wall 41 into two. The partition wall 42 has, for example, a flat plate shape. The case 40 has, for example, an H-shape in the ZX plane. The semiconductor module 20 is disposed on one side of the partition wall 42, and the capacitor 70 is disposed on the back side thereof. The partition wall 42 is disposed so as to enclose all the semiconductor modules 20 and the capacitor 70 in planar view in the Z direction. The partition wall 42 is disposed so as to enclose most of the output conductors 30 including connected portions with the output terminals 23.

The partition wall 42 continues to the side wall 41, for example. Such a case 40 is formed using a metal material having high thermal conductivity, such as aluminum-based material. The case 40 is, for example, formed by aluminum die-casting. The partition wall 42 has a flow path 421 inside. The refrigerant 602 is supplied into the flow path 421 via an undepicted introduction pipe. The refrigerant 602 that has flowed through the flow path 421 is discharged via an undepicted discharge pipe. The flow path 421 can be provided to effectively cool each semiconductor module 20 and the capacitor 70. The partition wall 42 in this embodiment has two flow paths 421. One of the flow paths 421 extends in the X direction so as to overlap with each of the semiconductor modules 20 in the first row 201, and the other one extends in the X direction so as to overlap with each of the semiconductor modules 20 in the second row 202. The two flow paths 421 overlap with the capacitor 70 in planar view in the Z direction.

In this way, the partition wall 42 of the case 40 provides a cooler 63. The cooler 63 corresponds to a third cooler. The cooler 60 in this embodiment includes the coolers 61 and 62 described in the second embodiment in addition to the cooler 63. The cooler 60 is disposed on either side of the semiconductor module 20 in the Z direction. The coolers 61 and 62 each cool the semiconductor module 20 from a one side 22a side of the sealing body 22, and the cooler 63 cools the semiconductor module 20 from a back side 22b side. In the Z direction, the capacitor 70, the cooler 63 (partition wall 42), the semiconductor module 20, and the coolers 61 and 62 are stacked in this order.

The partition wall 42 has through holes 423. Each through hole 423 extends in the Z direction and communicates with two housing spaces separated by the partition wall 42. The positive electrode conductor 31P extends from the space housing the capacitor 70 through the through hole 423 to the space housing the semiconductor modules 20, and is connected to the P terminal 24P. Similarly, the negative electrode conductor 31N extends from the space housing the capacitor 70 through the through hole 423 to the space housing the semiconductor modules 20, and is connected to the N terminal 24N.

The case 40 has openings at its two ends in the Z direction. As illustrated in FIG. 9, the power conversion device 4 may include covers 45 and 46 to close the openings of the case 40. The cover 45 closes the opening for the housing space on the semiconductor module 20 side, and the cover 46 closes the opening for the housing space on the capacitor 70 side. The case 40 and the covers 45, 46 are sometimes referred to as a housing. It is also possible that in a configuration with no cover, the elements housed in the case 40 are liquid-tightly sealed by disposing a filler such as a potting resin in the case 40. Moreover, it is possible that in the configuration with the covers 45 and 46, the inside of the housing is liquid-tightly sealed by disposing a sealing component at a portion where the case 40 faces the cover, for example.

The power conversion device 4 may include a circuit board 80 as illustrated in FIG. 9. The circuit board 80 includes a wiring board with wirings disposed on an insulating substrate made of resin or the like, and undepicted electronic components mounted on the wiring board. The wirings and the electronic components form a circuit. The aforementioned drive circuit 7 is formed on the circuit board 80. The circuit board 80 is housed in the case 40. The circuit board 80 is housed in a space common to the semiconductor modules 20. The circuit board 80 is disposed on the side opposite to the semiconductor modules 20 with respect to the partition wall 42. The circuit board 80 is disposed above the coolers 61 and 62. The circuit board 80 is disposed so as to overlap with all the semiconductor modules 20 in planar view in the Z direction. The circuit board 80 is electrically connected to signal terminals 25 of the semiconductor modules 20.

Other configurations are similar to those described in the preceding embodiment. The circuit board 80 can be applied to any of the first, second, and third embodiments.

When switching elements connected in parallel are turned on and off synchronously, higher switching speed leads to greater influence of inductance of the conductor connecting the switching elements to each other. If the inductance of the conductor to the main electrode of each switching element is unbalanced between the switching elements, a potential difference will occur between main electrodes on low potential sides of the switching elements. In particular, in a type of switching element, the on/off state of which is determined by the potential difference between the main electrode on the low potential side and the gate electrode, when a potential difference occurs between the main electrodes on the low potential sides, current flows between the gates of the switching elements. When current flows between the gates, the potential difference between the electrodes on the low potential sides is reversed. If this is repeated, an oscillation phenomenon occurs. Such an oscillation phenomenon is called gate oscillation.

The power conversion device 4 of this embodiment includes the cooler 63 interposed between the semiconductor modules 20 and the capacitor 70. The cooler 63 faces at least part of each of the output conductors 30U, 30V, and 30W in the Z direction. Inductance of the output conductor 30 can be reduced by the magnetic flux canceling effect due to eddy current generated in the partition wall 42 forming the cooler 63. This makes it possible to reduce the potential difference between the source electrodes, which are the main electrodes on the low potential sides, in the four MOSFETs 13 forming the upper arm 10H for one phase. Consequently, occurrence of gate oscillation can be suppressed.

The semiconductor module 20 and the capacitor 70 can be cooled by one cooler 63. As described in the second embodiment, in a configuration with no capacitor 70, the cooler 60 may be disposed so as to face at least part of each of the output conductors 30U, 30V, and 30W. In this case, the magnetic flux canceling effect caused by the eddy current also can reduce the inductance of the output conductor 30 and suppress occurrence of gate oscillation.

The power conversion device 4 may include only the cooler 63 as the cooler 60. In other words, a configuration, in which the semiconductor modules 20 are cooled from one side, is also possible. In this embodiment, the cooler 60 is disposed on either side of the semiconductor module 20. As a result, the semiconductor module 20 can be effectively cooled.

The cooler 63 may be provided separately from the case 40. In this embodiment, the flow path 421 is provided within the wall of the case 40 to allow the case 40 to serve as the cooler 63. Consequently, the number of parts can be reduced. Furthermore, the power conversion device 4 can be reduced in height compared to a configuration with the cooler 63 as a separate component.

The position of the flow path 421 in the case 40 is not limited to the above exemplary case. For example, in the case of a box-shaped case with one side open, the flow path may be provided in the bottom wall. In this embodiment, the partition wall 42 is provided in the case 40, and the flow path 421 is provided in the partition wall 42. This makes it possible to cool the semiconductor module 20 by the one side of the cooler 63 and cool the capacitor 70 by the back side thereof while allowing the case 40 to serve as the cooler 63. Consequently, it is possible to reduce size in the direction perpendicular to the Z direction.

Fifth Embodiment

A fifth embodiment is a modification based on the preceding embodiment, where description of the preceding embodiment can be used as reference. In the preceding embodiment, one semiconductor module 20 provides one series circuit 12. Instead, the various arrangements described above may be applied in a configuration where one semiconductor module 20 provides one arm.

Figure 10:
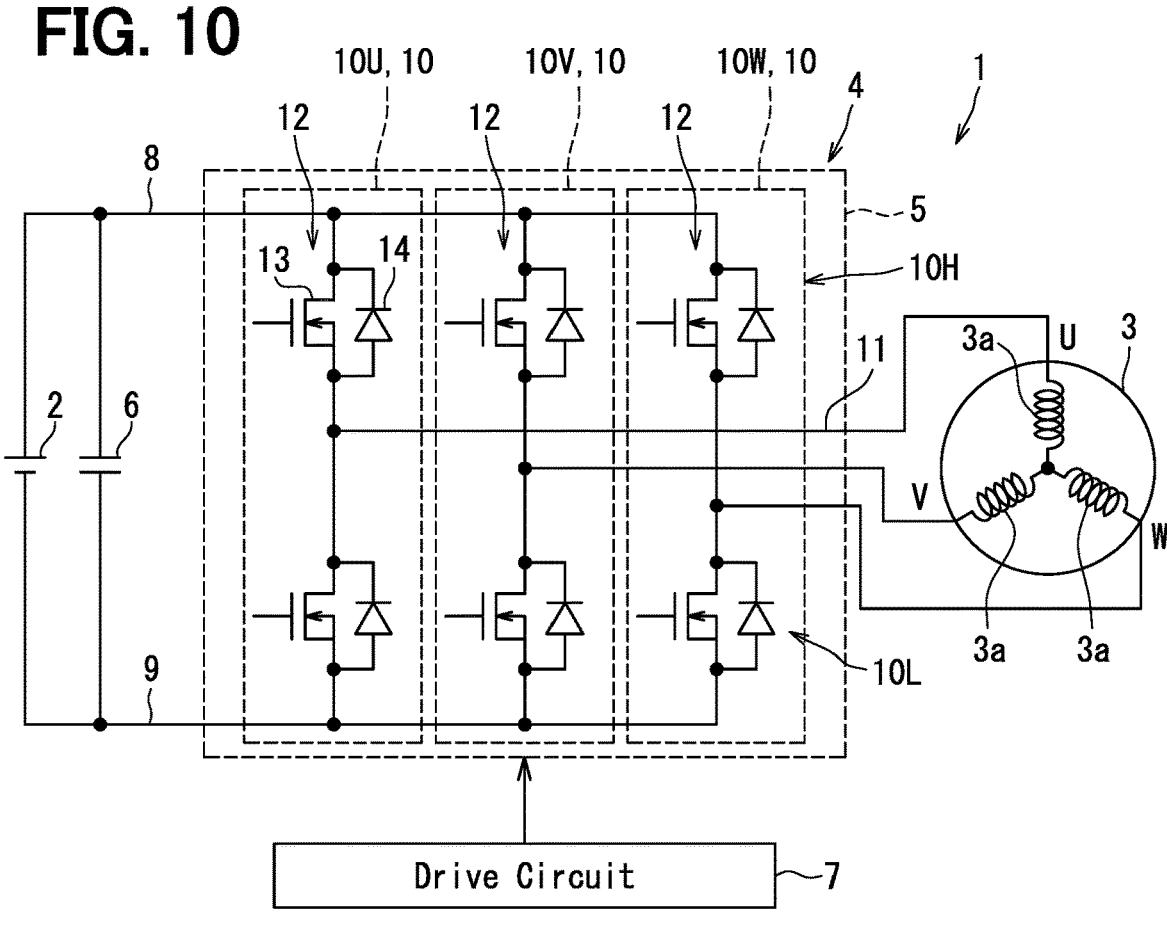
FIG. 10 illustrates a circuit configuration of the power conversion device according to a fifth embodiment.
Figure 11:
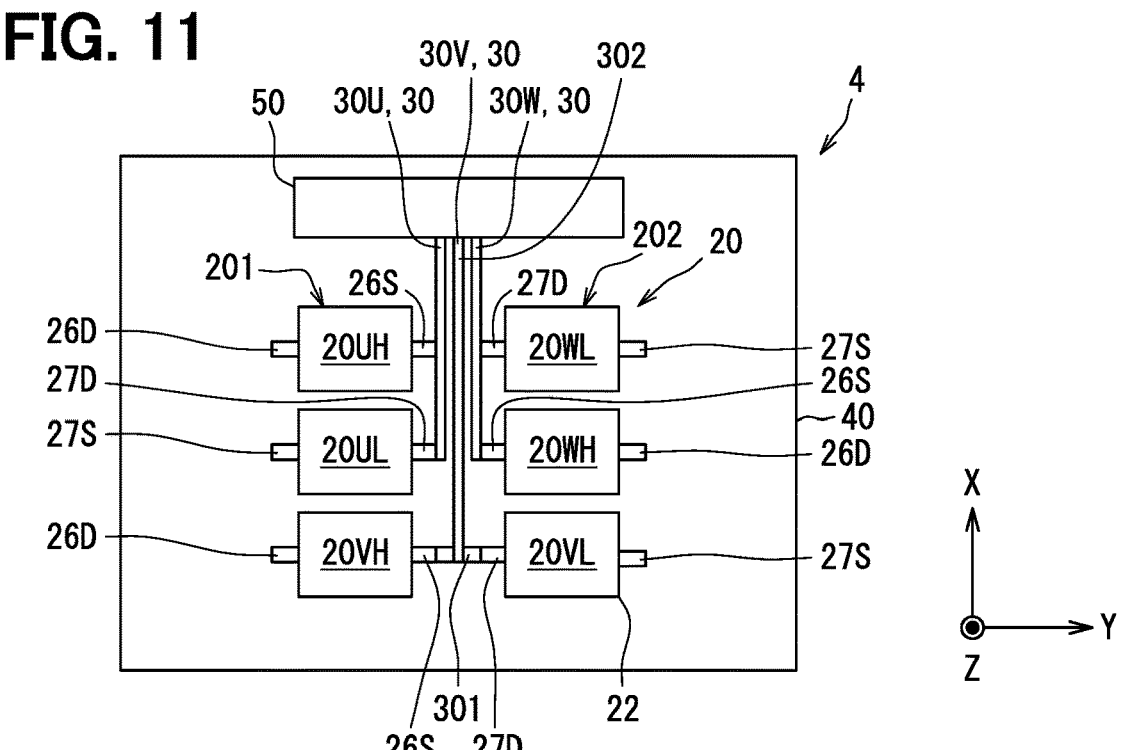
FIG. 11 is a planar view illustrating the power conversion device.

FIG. 10 shows an equivalent circuit of the power conversion device 4 of this embodiment. FIG. 11 is a planar view illustrating the power conversion device 4. FIG. 11 corresponds to FIG. 2.

As illustrated in FIG. 10, the upper-and-lower arm circuit 10 (10U, 10V, 10W) of each phase of the inverter 5 has only one series circuit 12. The series circuit 12 includes two MOSFETs 13 connected in series. The upper-and-lower arm circuit 10 for one phase includes two MOSFETs 13.

As illustrated in FIG. 11, the power conversion device 4 includes six semiconductor modules 20 forming the inverter 5. Unlike the preceding embodiment, one semiconductor module 20 provides one arm 10H and one arm 10L. In other words, the multiple semiconductor modules 20 include semiconductor modules 20UH, 20VH, and 20WH forming the upper arms 10H, and semiconductor modules 20UL, 20VL, and 20WL forming the lower arms 10L. The semiconductor modules 20UH, 20VH, 20W correspond to the upper arm module, and the semiconductor modules 20UL, 20VL, 20WL correspond to the lower arm module.

The semiconductor modules 20UH and 20UL form a U-phase upper-and-lower arm circuit 10U. The semiconductor modules 20VH and 20VL form a V-phase upper-and-lower arm circuit 10V. The semiconductor modules 20WH and 20WL form a W-phase upper-and-lower arm circuit 10W. One semiconductor module 20 has the same number of the semiconductor elements 21 as switching elements forming one arm. Although not shown, each of the semiconductor modules 20 in this embodiment includes one semiconductor element 21. The semiconductor module 20 includes a drain terminal electrically connected to the drain electrode and a source terminal electrically connected to the source electrode, as main terminals protruding from the sealing body 22.

The semiconductor modules 20UH, 20VH, and 20WH each have a drain terminal 26D and a source terminal 26S. The semiconductor modules 20UL, 20VL, and 20WL each have a drain terminal 27D and a source terminal 27S. The drain terminal 26D serves as a power terminal (P terminal), while the source terminal 27S serves as another power terminal (N terminal). The source terminal 26S and the drain terminal 27D each serve as a midpoint terminal for connecting the upper arm 10H and the lower arm 10L, i.e., serve as an output terminal to the motor generator 3. Hereinafter, the drain terminal 26D and the source terminal 27S may be referred to as the power terminals 26D and 27S, respectively, and the source terminal 26S and the drain terminal 27D may be referred to as output terminals 26S and 27D, respectively.

The six semiconductor modules 20 are arranged in two rows of three each, as in the preceding embodiment. The two semiconductor modules 20UH and 20UL forming the U-phase upper-and-lower arm circuit 10U are successively arranged in the X direction to form the first row 201. The two semiconductor modules 20WH and 20WL forming the W-phase upper-and-lower arm circuit 10W are successively arranged in the X direction to form the second row 202. The semiconductor modules 20WH and 20WL are disposed so as to face the semiconductor modules 20UH and 20UL in the Y direction. The two semiconductor modules 20VH and 20VL forming the V-phase upper-and-lower arm circuit 10V are arranged in the Y direction. The semiconductor module 20VH forms the first row 201, while the semiconductor module 20VL forms the second row 202.

In this way, only the semiconductor modules 20VH and 20VL are arranged in the Y direction. The three semiconductor modules 20 forming the first row 201 are arranged in the order of the semiconductor module 20UH, the semiconductor module 20UL, and the semiconductor module 20VH. The three semiconductor modules 20 forming the second row 202 are arranged in the order of the semiconductor module 20WL, the semiconductor module 20WH, and the semiconductor module 20VL.

If two semiconductor modules 20 of a common phase are regarded as one piece, the six semiconductor modules 20 form a roughly U shape in planar view in the Z direction. The U phase, the W phase, and the V phase correspond to a first phase, a second phase, and a third phase, respectively. The semiconductor modules 20U, 20W, and 20V correspond to first modules, and the semiconductor modules 20WH and 20WL corresponds to second modules, and, the semiconductor modules 20VH and 20VL correspond to third modules.

The output terminals 26S and 27D of the semiconductor modules 20 forming the first row 201 each protrude from the side surface, which faces the second row 202, among the side surfaces of the sealing body 22. The output terminals 26S and 27D of the semiconductor modules 20 forming the second row 202 each protrude from the side surface, which faces the first row 201, among the side surfaces of the sealing body 22. In other words, every output terminal 26S and 26D (midpoint terminal) protrudes from the inner side surface. The power terminals 26D and 27S of the semiconductor modules 20 forming the first row 201 each protrude from the side surface opposite to the output terminal 26S or 27D. The power terminals 26D and 27S of the semiconductor modules 20 forming the second row 202 each protrude from the side surface opposite to the output terminal 26S or

27D. In other words, every power terminal 26D and 26S protrudes from the outer side surface.

The output conductors 30 are disposed in the same way as in the preceding embodiment. The output conductor 30U electrically connects the output terminals 26S and 27D of the respective semiconductor modules 20UH and 20UL arranged in the X direction. The output conductor 30U connects the semiconductor modules 20UH and 20UL in series. The output conductor 30W electrically connects the output terminals 26S and 27D of the respective semiconductor modules 20WH and 20WL arranged in the X direction. The output conductor 30W connects the semiconductor modules 20WH and 20WL in series. The output conductor 30V electrically connects the output terminals 26S and 27D of the respective semiconductor modules 20VH and 20VL. The output conductor 30V connects the semiconductor modules 20VH and 20VL in series.

The output conductor 30V has a connected portion 301 and an extending part 302. The connected portion 301 includes a portion extending in the Y direction to electrically connect between the output terminals 23. Each of the output conductors 30 (30U, 30V, 30W) extends from the connected portion of the corresponding output terminal 26S or 27D in a direction away from the semiconductor module 20VH or 20VL. The extending part 302 of the output conductor 30V is disposed between the output conductors 30U and 30W in the Y direction. The three output conductors 30 are arranged in the order of the output conductor 30U, the output conductor 30V, and the output conductor 30W in the Y direction. The output conductors 30 are disposed so that their plate surfaces face each other in the extending parts thereof in the X direction. Other configurations are similar to those described in the first embodiment.

As described above, in this embodiment, the six semiconductor modules 20 are arranged in two rows of three each. The two semiconductor modules 20UH and 20UL forming the U-phase upper-and-lower arm circuit 10U are disposed in the first row 201. The two semiconductor modules 20WH and 20WL forming the W-phase upper-and-lower arm circuit 10W are disposed in the second row 202. The semiconductor module 20VH and the semiconductor module 20VL, which form the V-phase upper-and-lower arm circuit 10V, are disposed in the first and second rows 201 and 202, respectively.

As a result, while the common-phase output terminals 26S and 27D (midpoint terminal) are electrically connected by the output conductor 30, the connection structure between the semiconductor module 20 and the output conductor 30 (midpoint conductor) forms a roughly U-shape. In the X direction, one end of the connection structure is closed by the semiconductor modules 20VH and 20VL and part of the output conductor 30V (third conductor), and the other end is an open end. In the X direction, since the output conductors 30U, 30V, and 30W can be led out toward the open end, the power conversion device 4 can be reduced in height.

In this embodiment, as in the preceding embodiment, the extending part 302 of the output conductor 30V (third conductor) is disposed between the output conductor 30U (first conductor) and the output conductor 30W (second conductor) in the Y direction. Consequently, it is possible to further reduce height of the power conversion device 4.

The output conductors 30U, 30V, and 30W in this embodiment are disposed so that their plate surfaces face each other in the Y direction, as in the preceding embodiment. As a result, size of the power conversion device 4 in the Y direction can be reduced.

As in the preceding embodiment, the power terminals 26D and 27S in this embodiment protrude from the surfaces opposite to the surfaces for the output terminals 26S and 27D. This eliminates the need for wiring that bypasses the power terminals 26D and 27S and the power conductor 31, making it possible to simplify lead-out of the output terminals 26S and 27D.

The arrangement of the six semiconductor modules 20 is not limited to the above exemplary case. As described in the first the embodiment, positions of the semiconductor modules 20 may be replaced with each other.

The number of the series circuits 12 forming the upper-and-lower arm circuit 10 for one phase, i.e., the number of the semiconductor modules 20 of each phase, is not limited to one. The number may be two or more. In the case of two, for example, the first row 201 includes the semiconductor module 20UH, the semiconductor module 20UL, the semiconductor module 20UH, the semiconductor module 20UL, the semiconductor module 20VH, and the semiconductor module 20VH arranged in this order. The second row 202 includes the semiconductor module 20WL, the semiconductor module 20WH, the semiconductor module 20WL, the semiconductor module 20WH, the semiconductor module 20VL, and the semiconductor module 20VL arranged in this order.

The number of the switching elements forming each arm 10H or 10L is not limited to one. Multiple switching elements may be connected in parallel to form the arm 10H or 10L. In this case, the semiconductor module 20 includes the same number of the semiconductor elements 21 as the switching elements forming the arm 10H or 10L.

An example, where a portion, in which the plate surfaces of the output conductors 30 face each other, is disposed above the output terminals 23 in the Z direction, has been non-exclusively given. The portion may be disposed below the output terminals 23.

The configuration described in this embodiment can be combined with each of the configurations of the first, second, third, and fourth embodiments.

The disclosure in this description, the drawings, and the like is not limited to the illustrated embodiments. The disclosure encompasses the illustrated embodiments and variations made by those skilled in the art based on the embodiments. For example, the disclosure is not limited to the combinations of the components and/or elements described in the embodiments. The disclosure can be implemented in various combinations. The disclosure can include an additional portion that can be added to each embodiment. The disclosure encompasses each embodiment from which a component and/or an element is/are omitted. The disclosure encompasses substitution or a combination of components and/or elements between one embodiment and another embodiment. The disclosed technical scope is not limited to the description of the embodiments. The several technical scopes disclosed are indicated by the statements of claims and should be further understood to include all modifications within the meaning and scope equivalent to the statements of the claims.

The disclosure in the description, drawings, and the like is not limited by the statements of the claims. The disclosure in the description, drawings, and the like includes the technical ideas described in the claims, and further extends to a more diverse and broader technical ideas than those described in the claims. Therefore, various technical ideas can be extracted from the disclosure of the description, drawings, and the like without being restricted by the statements of the claims.

When an element or phase is referred to as being "on", "coupled", "connected", or "bonded", the element or phase may be directly on, coupled, or connected to another element or phase, or an intervening element or intervening phase may exist between the elements or the phases. In contrast, when one element is referred to as being "directly on," "directly coupled with," "directly connected to," or "directly bonded to" another element or phase, no intervening element or intervening phase exist therebetween. Other words used to describe relationships between elements should be interpreted in a similar manner (e.g., "between" to "directly between," "adjacent" to "directly adjacent," etc.). As used herein, the term "and/or" includes any and all combinations of one or more of the associated listed items.

The spatially relative terms "in," "out," "back," "under," "low," "above," "high," and the like are utilized herein to facilitate descriptions that explain the relationship of one element or feature to another element or feature, as shown in the figures. Spatially relative terms can be intended to encompass different directions of the device during use or operation in addition to directions depicted in the figures. For example, when the device in the figure is turned over, an element described as "under" or "directly under" another element or feature is directed "above" such another element or feature. Thus, the term "under" can encompass both the directions, above and under. The device may be oriented in another direction (may be rotated 90 degrees or in another direction) and the spatially relative descriptors used herein will be interpreted accordingly.

The vehicle drive system 1 is not limited to the aforementioned configurations. For example, an example, where one motor generator 3 is provided, has been non-exclusively given. Multiple motor generators may be provided.

An example, where the power conversion device 4 includes the inverter 5 as the power conversion circuit, has been non-exclusively given. For example, the power conversion device 4 may include multiple inverters. The power conversion device 4 may include at least one inverter and a converter. The power conversion device 4 may include only the converter. The power conversion device 4 forms a converter including a three-phase upper-and-lower arm circuit. The midpoint of the upper-and-lower arm circuit is electrically connected to the inductor.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A power conversion device, comprising:
    semiconductor modules forming a power conversion circuit including upper-and-lower arm circuits operable in three phases, the semiconductor modules including power terminals and midpoint terminals, the midpoint terminals forming midpoints of the upper-and-lower arm circuits; and
    midpoint conductors electrically connecting common-phase terminals of the midpoint terminals, wherein
    the semiconductor modules include
        first modules forming a first-phase circuit of the upper-and-lower arm circuits and successively arranged in a first direction so as to form a part of a first row of the semiconductor modules, the first row extending in the first direction, second modules forming a second-phase circuit of the upper-and-lower arm circuits and successively arranged in the first direction so as to form a part of a second row of the semiconductor modules, the second row extending in the first direction, the second modules facing the first modules in a second direction perpendicular to the first direction such that the first row and the second row are shifted from each other in the second direction, and third modules forming a third-phase circuit of the upper-and-lower arm circuits and arranged in the second direction such that at least one of the third modules forms a part of the first row and a rest of the third modules forms a part of the second row, the midpoint conductors include a first conductor electrically connecting midpoint terminals of the first modules, a second conductor electrically connecting midpoint terminals of the second modules, and a third conductor electrically connecting midpoint terminals of the third modules, semiconductor modules forming the first row have surfaces facing the second row and from which midpoint terminals protrude toward the second row, semiconductor modules forming the second row have surfaces facing the first row and from which midpoint terminals protrude toward the first row, and each of the midpoint conductors extends in the first direction from a connected portion of a corresponding midpoint terminal, the first direction being a direction from the third modules toward the first modules and the second modules.

2. The power conversion device according to claim 1, wherein a portion of the third conductor extending in the first direction is disposed between the first conductor and the second conductor in the second direction.

3. The power conversion device according to claim 2, wherein the midpoint conductors have plate shapes and have surfaces facing each other in the second direction.

4. The power conversion device according to claim 1, wherein the power terminals protrude from surfaces of the semiconductor modules opposite from the surfaces from which the midpoint terminals protrude.

5. The power conversion device according to claim 1, further comprising a cooler facing the semiconductor modules in a third direction perpendicular to the first direction and the second direction, the cooler being configured to cool each of the semiconductor modules, wherein the cooler is disposed to collectively cool the semiconductor modules in each of the first row and second row.

6. The power conversion device according to claim 5, wherein the cooler includes a first cooler configured to cool the semiconductor modules forming the first row, and a second cooler configured to cool the semiconductor modules forming the second row.

7. The power conversion device according to claim 1, further comprising:

a capacitor overlapped with at least part of each of the semiconductor modules in planar view along a third direction perpendicular to the first direction and the second direction; and power conductors electrically connecting the capacitor and the power terminals of the semiconductor modules.

8. The power conversion device according to claim 5, further comprising:

a capacitor; and power conductors electrically connecting the capacitor and the power terminals of the semiconductor modules, wherein each phase circuit of the upper-and-lower arm circuits includes series circuits connected in parallel to each other, each of the semiconductor modules forms one of the series circuits, the midpoint conductors each connect semiconductor modules of a corresponding phase circuit of the upper-and-lower arm circuits in parallel, and the cooler is disposed between the capacitor and the semiconductor modules such that the cooler faces at least a part of each of the midpoint conductors in the third direction.

9. The power conversion device according to claim 1, wherein each phase circuit of the upper-and-lower arm circuits includes series circuits connected in parallel to each other, each of the semiconductor modules forms one of the series circuits, and the midpoint conductors each connect semiconductor modules of a corresponding phase circuit of the upper-and-lower arm circuits in parallel.

10. The power conversion device according to claim 1, wherein the first module, the second module, and the third module each include an upper arm module forming an upper arm of a corresponding phase circuit of the upper-and-lower arm circuits, and a lower arm module forming a lower arm of the corresponding phase circuit of the upper-and-lower arm circuits, and the midpoint conductors each connect the upper arm module and the lower arm module of the corresponding phase circuit in series.

* * * * *